(12) United States Patent
Ogawa et al.

(10) Patent No.: US 12,400,826 B2
(45) Date of Patent: Aug. 26, 2025

(54) CHARGED PARTICLE BEAM DEVICE

(71) Applicant: Hitachi High-Tech Corporation, Tokyo (JP)

(72) Inventors: Hironori Ogawa, Tokyo (JP); Masaki Mizuochi, Tokyo (JP); Motohiro Takahashi, Tokyo (JP); Takanori Kato, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 449 days.

(21) Appl. No.: 17/964,328

(22) Filed: Oct. 12, 2022

(65) Prior Publication Data

US 2023/0137117 A1 May 4, 2023

(30) Foreign Application Priority Data

Nov. 4, 2021 (JP) .................................. 2021-180189

(51) Int. Cl.
*H01J 37/20* (2006.01)
*H01J 37/28* (2006.01)

(52) U.S. Cl.
CPC .............. *H01J 37/20* (2013.01); *H01J 37/28* (2013.01)

(58) Field of Classification Search
CPC .. H01J 37/00; H01J 37/02; H01J 37/26; H01J 37/28; H01J 37/20; H01J 37/265; H01J 2237/20221; H01J 2237/20285; H01J 2237/20292; H01J 2237/2817
USPC .............................. 250/492.3, 306, 307, 311
See application file for complete search history.

(56) References Cited

U.S. PATENT DOCUMENTS

| | | | | |
|---|---|---|---|---|
| 2009/0084953 A1* | 4/2009 | Harada | ................ | G01N 23/225 250/307 |
| 2014/0183357 A1* | 7/2014 | Smith | ..................... | H01J 37/20 250/307 |
| 2015/0248991 A1* | 9/2015 | Ogawa | ............... | G01B 9/02021 250/491.1 |
| 2016/0379795 A1* | 12/2016 | Watanabe | ............... | H01J 37/28 250/310 |
| 2019/0113470 A1 | 4/2019 | Mueller et al. | | |

* cited by examiner

*Primary Examiner* — Jason L McCormack
(74) *Attorney, Agent, or Firm* — Crowell & Moring LLP

(57) ABSTRACT

A charged particle beam device according to the present invention includes a first movement table and a second movement table disposed above the first movement table, measures a first relative position between a sample chamber and the first movement table, a second relative position between the sample chamber and the second movement table, and a third relative position between a lens barrel and a sample, and corrects a relative position between the first movement table and the second movement table according to the first relative position and the second relative position.

13 Claims, 7 Drawing Sheets

CHARGED PARTICLE BEAM DEVICE

BACKGROUND OF THE INVENTION

1. Field of the Invention

TECHNICAL FIELD

The present invention relates to a charged particle beam device.

BACKGROUND ART

Along with miniaturization of semiconductor elements, not only manufacturing apparatuses but also inspection and evaluation apparatuses are required to have high accuracy corresponding thereto. Usually, a scanning electron microscope (hereinafter, referred to as SEM) is used to evaluate a pattern formed on a semiconductor wafer or inspect defects of the formed wafer. In particular, a critical-dimension SEM (CD-SEM) is used to evaluate the shape dimension of the pattern.

The CD-SEM is a device that irradiates a wafer with an electron beam, performs image processing on an obtained secondary electron signal, determines an edge of a pattern from a change in brightness, and measures a dimension of a pattern formed on the wafer. The CD-SEM is provided with an XY stage capable of positioning a desired position on the wafer at a beam irradiation position in order to observe and inspect the entire wafer. Examples of the XY stage include a stage driven by a rotary motor and a ball screw and a stage driven by a linear motor. In addition to the XY plane, a Z-axis stage or a stage that performs rotational movement about the Z-axis may be used. In particular, in recent years, in order to realize ultra-precise positioning, a non-contact type floating stage using pressure such as air or electromagnetic force is often configured.

There are several types of configurations of such a floating stage. For example, from the viewpoint of controllability and manufacturability maintenance, in the conventional stack (two-stage stack) type XY stage, the upper axis stage may be configured as a floating stage. In such a configuration, the lower axis stage can move only in one direction, whereas the upper axis stage can move in a plurality of directions (typically, directions of six degrees of freedom). In addition, not only the floating stage but also a top table on which a wafer or the like is placed can be operated in a plurality of directions (for example, X and Z directions) with respect to the movement table of the lower axis using a guide mechanism, an elastic hinge, or the like.

In the stage device having such a configuration, driving means (motor) is arranged so as to be operable in each direction of the degrees of freedom, position detecting means (sensor) corresponding to each degree of freedom is provided, and the measurement result is constantly fed back to the driving means, whereby the control amount corresponding to each degree of freedom is controlled. As the position detection means, a linear scale, a laser interferometer, or the like is generally used.

For example, when positions of the top table in a plurality of directions with respect to the lower axis table are detected using a plurality of linear scales, there is a problem that it is difficult to improve the absolute accuracy of the top table. As a factor of this, since the position of the top table is controlled with respect to the lower axis table, the position of the top table is affected by deformation, posture change, and the like of the lower axis table. In addition, since the top table is controlled using the sensor value of the linear scale, the top table is greatly affected by the accuracy of the linear scale alone and the attachment accuracy of the linear scale (angle deviation or the like). As a result, even if the position can be accurately positioned on the sensor value, there is a problem that a deviation occurs in the position with respect to the column irradiated with the electron beam, and as a result, the positional accuracy in the SEM image deteriorates.

On the other hand, as a method for directly detecting the position of the top table with reference to the column or the sample chamber, a method using a laser interferometer and a reflecting mirror is also known. The laser interferometer can irradiate the reflecting mirror with laser beam and detect a stage position with a resolution on the order of several tens of picometers by interference with the reflected wave. In addition, since the measurement can be performed at the same height as the wafer, the Abbe error is minimized, and it is widely used in position measurement of many precision stages including the CD-SEM. However, even in a case where the laser interferometer is used, the relative positions of the lower axis table and the top table cannot be measured. Therefore, the positions of the top table and the lower axis table cannot be accurately controlled only by the laser interferometer.

Similarly, also in the height direction, it is not easy to adjust the height of the top table with respect to the column due to the influence of the lower axis table and the influence of the sensor accuracy. In order to perform focusing in the SEM with high speed and high accuracy, a height sensor (hereinafter, referred to as a Z sensor) based on the column is often installed, but the responsiveness is low, and feedback control using the Z sensor value is not realistic.

In order to solve such a problem, US2019/0113470 (U.S. Ser. No. 10/345,250) discloses a technique of adjusting the height between the sample surface and the objective lens based on the focusing current determined by converging the charged particle beam using the objective lens.

SUMMARY OF THE INVENTION

According to the technique disclosed in US2019/0113470 (U.S. Ser. No. 10/345,250), the wafer can be adjusted to a desired height by controlling the position of the top table in accordance with the height of the sample surface. However, since the focusing current is calculated using the objective lens, the time required for the height alignment increases, and the throughput of the measurement inspection decreases. Further, it is not possible to improve the positional accuracy in, for example, the XY direction other than the height direction.

An object of the present invention is to address the above problems and to provide a stage device capable of accurately and quickly positioning the position of the top table with respect to the column, and a charged particle beam device including the stage device.

A charged particle beam device according to the present invention includes a first movement table and a second movement table disposed above the first movement table, measures a first relative position between a sample chamber and the first movement table, a second relative position between the sample chamber and the second movement table, and a third relative position between a lens barrel and a sample, and corrects a relative position between the first movement table and the second movement table according to the first relative position and the second relative position.

According to the charged particle beam device of the present invention, even when there is deformation, posture change, a sensor assembly error, or the like of the first movement table (lower axis table), it is possible to accurately and quickly position the position of the second movement table (top table) with respect to the column by correcting the relative position between the first movement table and the second movement table.

DESCRIPTION OF THE PREFERRED EMBODIMENTS

Figure 1:
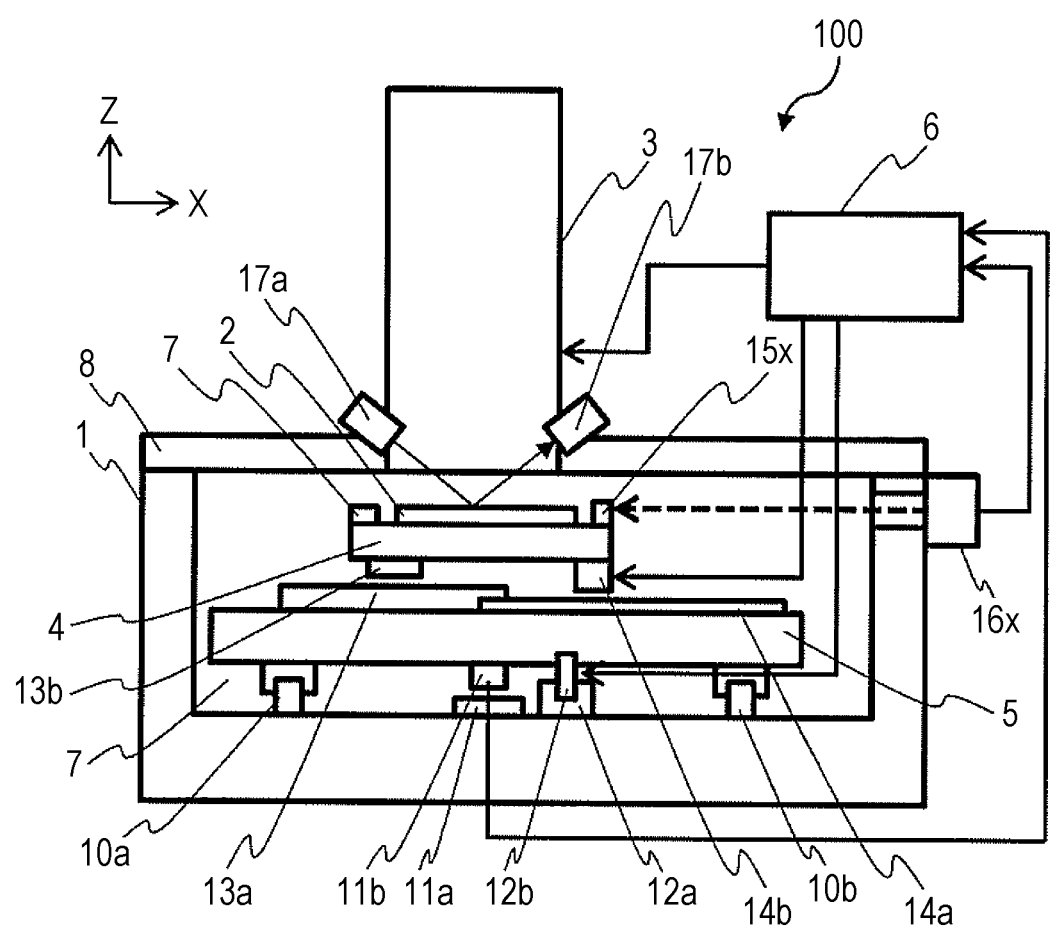
FIG. 1 is a side sectional view of a charged particle beam device.

FIG. 1 is a side sectional view of a charged particle beam device 100 according to an embodiment of the present invention. In FIG. 1, on the bottom surface on the inner side of a sample chamber 1, a Y table 5 that can freely move in a Y direction (depth direction in the drawing) via two Y linear guides 10a and 10b is disposed, and a Y linear motor 12 (12a and 12b in FIG. 1) is disposed so as to relatively generate thrust in the Y direction between the sample chamber 1 and the Y table 5. In the sample chamber 1, a Y linear scale 11a is arranged in the Y direction, and a Y linear scale detector 11b is arranged on the bottom surface of the Y table 5 so as to face the Y linear scale 11a. The Y linear scale 11a measures a relative displacement amount in the Y direction between the Y table 5 and the sample chamber 1.

A top table 4 is disposed above the Y table 5. On the Y table 5, an X linear motor 14 (a stator 14a and a mover 14b in FIG. 1) is disposed so as to generate thrust in an X direction between the Y table 5 and the top table 4. In addition, an X linear scale 13a is arranged on the Y table 5, and an X linear scale detector 13b is arranged on the bottom surface of the top table 4 so as to face the X linear scale 13a. The X linear scale 13a measures a relative displacement amount in the X direction between the top table 4 and the Y table 5.

Furthermore, five motors (not illustrated) and five linear scales (not illustrated) for restraining five degrees of freedom (Y, Z, θx, θy, and θz) other than the X direction by feedback control are configured between the Y table 5 and the top table 4. The five motors can be configured using a linear-motion motor such as a linear motor or a voice coil motor. In this case, for example, thrust and moment of five degrees of freedom can be generated by using two motors in the Y direction and three motors in the Z direction in combination. In addition, a rotary motor can be used as some motors, or a redundant system can be configured using five or more motors. Similarly, with respect to the five linear scales, for example, by using two linear scales in the Y direction and three linear scales in the Z direction in combination, displacement and posture change in five degrees of freedom can be detected. In addition, the stage can be similarly configured using various position sensors such as an optical sensor other than the linear scale and a position sensor using electrostatic capacitance. Using the obtained five-axis linear scale values, a control device 6 performs feedback control calculation to appropriately control the five-axis motor thrust. As a result, a pseudo restraint other than the X direction is realized (moving only in the X direction in a pseudo manner). As a result, the top table 4 can be positioned in the X direction using the X linear scale 13a and the X linear motor 14.

As described above, a sample stage can be configured with the Y table 5 that can be positioned in the Y direction with respect to the sample chamber 1 and the top table 4 that can be positioned in a plurality of directions including the X direction with respect to the Y table 5.

The wafer 2 is arranged on the top table 4. A wafer holding mechanism having a holding force such as a mechanical restraint force or an electrostatic force is used for arranging the wafer 2.

A top plate 8 and a column 3 are disposed on the sample chamber 1. The column 3 is provided with an electron optical system for generating a secondary electron image by an electron beam. In addition, the column 3 includes a Z sensor 17 (optical sensor) that detects the relative height between the column 3 and the wafer 2. The Z sensor 17 includes a light emitting unit 17a and a light receiving unit 17b, and can optically detect a change in height of the surface of the wafer 2.

An X mirror 15x is disposed on the top table 4. An X laser interferometer 16x is disposed on a side surface of the sample chamber 1. The X laser interferometer 16x irradiates the X mirror 15x with laser beam, and measures a relative displacement amount (hereinafter, referred to as an X laser value) in the X direction between the sample chamber 1 and the top table 4 using the reflected light. The X mirror 15x has a mirror surface on a YZ plane and has a long rod-like shape in the Y direction, and can reflect laser beam even when the Y table 5 moves in the Y direction. Similarly, in the Y direction, a relative displacement amount (hereinafter, referred to as a Y laser value) in the Y direction between the sample chamber 1 and the top table 4 can be measured by a Y laser interferometer 16y (illustrated in FIG. 2) and a Y mirror 15y (illustrated in FIG. 2). Each of the laser interferometers 16x and 16y in the X and Y directions can measure an effective value only in a region where each of the corresponding bar mirrors 15x and 15y in the X and Y directions are irradiated with the laser beam in the movable range of the top table 4. In the laser interferometer, once the X table moves to a position where the laser beam is not reflected, an offset amount of the laser value becomes indefinite thereafter, and an absolute position cannot be measured.

The control device 6 includes an arithmetic processing unit, a motor driving amplifier, and the like. The control device 6 drives the stage in the XY direction by controlling the drive current of the linear motor using the laser value and the scale value in the XY direction as inputs in addition to the five-axis control of the top table described above, and performs positioning at a desired position. As a method of controlling the linear motor, proportional-integral-derivative (PID) control or the like can be used.

With the above configuration, the wafer 2 is moved substantially on the XY plane with respect to the sample chamber 1, and a relative height (Z direction) and a posture (θx, θy, and θz direction) between the top table 4 and the Y table 5 become slightly operable, and a secondary electron image (SEM image) by the column 3 can be acquired at an arbitrary coordinate on the wafer 2.

Further, an adjustment sample 7 is arranged on the top table 4. The adjustment sample 7 is mainly used for adjustment of an electron optical system that emits an electron beam, and is arranged on the top table 4 so that an SEM image necessary for the adjustment can be acquired even in a state where the wafer 2 is not held. The height of the adjustment sample 7 is set to coincide with the height of the wafer 2. As a result, it is possible to similarly observe the adjustment sample 7 in the setting state of the electron optical system at the time of observing the wafer 2. A plurality of adjustment samples 7 are generally arranged on the top table 4.

Figure 2:
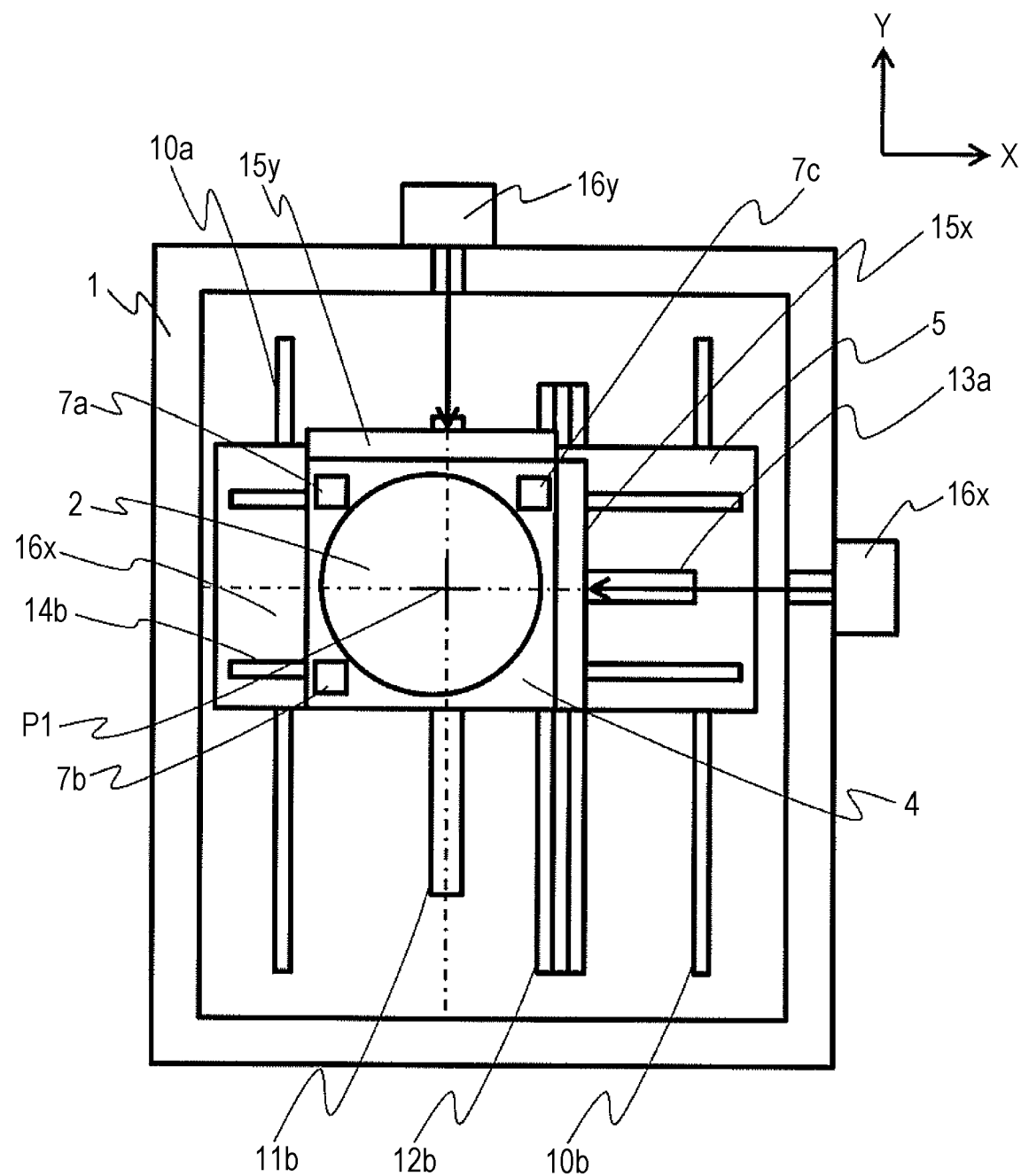
FIG. 2 is a top view of the charged particle beam device.

FIG. 2 is a top view of the charged particle beam device 100. In the table position arrangement of FIG. 2, the wafer 2 can be observed. The description of the same reference numerals as those in FIG. 1 will be omitted.

The laser beams of the laser interferometers 16x and 16y are emitted to the mirrors 15x and 15y, and the XY coordinates of the stage can be measured by both the scale value and the laser value.

A position P1 in FIG. 2 is an intersection of laser beams emitted from the laser interferometers 16x and 16y, and the column 3 is arranged such that the center of the column 3 (a position irradiated with an electron beam for acquiring a secondary electron image) coincides with P1. As a result, the position information of the measurement point (electron beam irradiation position) can be set to the laser value without Abbe error with respect to the posture change (yawing) about the Z axis of the wafer. In addition, the Z sensor 17 (not illustrated) is also configured to raise the wafer 2 at the position P1, and as a result, the relative height between the wafer 2 and the column 3 at the electron beam irradiation position can be detected.

The control device 6 performs SEM observation by controlling the positions of the Y table 5 and the top table 4 based on the measurement position information of the wafer 2 so that a desired observation position coincides with the position P1.

Three adjustment samples 7 (7a, 7b, and 7c) are arranged on the top table 4. The respective adjustment samples are arranged inside the four sides of the top table 4 around the wafer 2 and in the effective ranges of the X mirror 15x and the Y mirror 15y (positions where the laser beam of the laser interferometer 16 can be emitted), and are arranged at positions separated from each other by a distance. By arranging the adjustment sample 7 in this manner, it is possible to improve the accuracy of the correction processing by a reference point to be described later.

Figure 3:
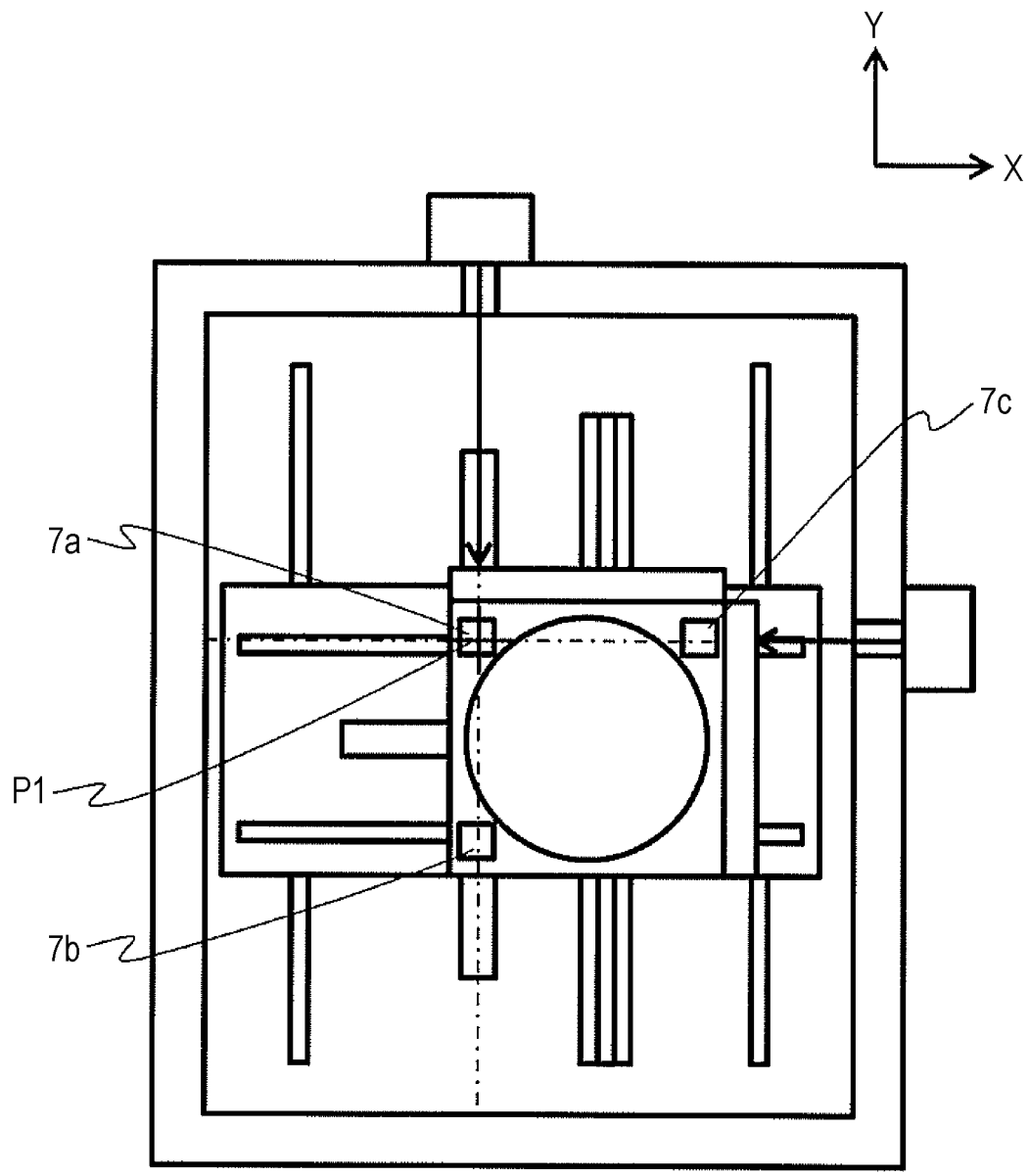
FIG. 3 is a top view of the charged particle beam device.

FIG. 3 is a top view of the charged particle beam device 100. In the table position arrangement of FIG. 3, the adjustment sample 7a can be observed. The description of the same reference numerals as those in FIGS. 1 and 2 will be omitted.

The adjustment sample 7a is positioned at an electron beam irradiation position P1, and an SEM image of the adjustment sample 7a can be acquired. At this time, the laser beams of the laser interferometers 16x and 16y are emitted to the mirrors 15x and 15y, and the XY coordinates of the stage can be measured by both the scale value and the laser value.

As described above, since the adjustment sample 7 can be observed even in a state where the wafer 2 is not held on the stage, the adjustment sample 7 is used at the time of adjustment, calibration, or the like of the electron optical system. The height of the adjustment sample 7 is detected by the Z sensor.

Figure 4A:
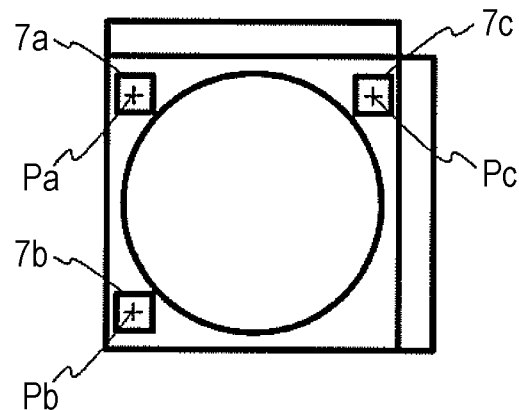
FIGS. 4A to 4C are layout diagrams of an adjustment sample on a top table.
Figure 4B:
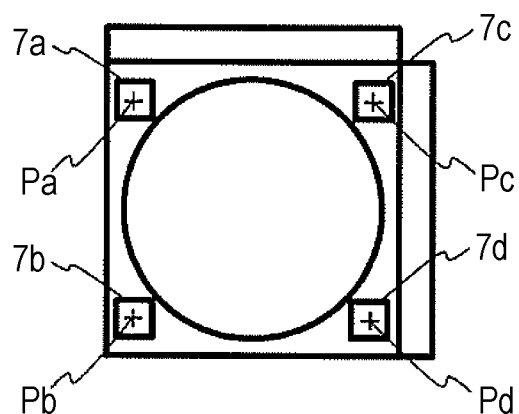
Figure 4C:
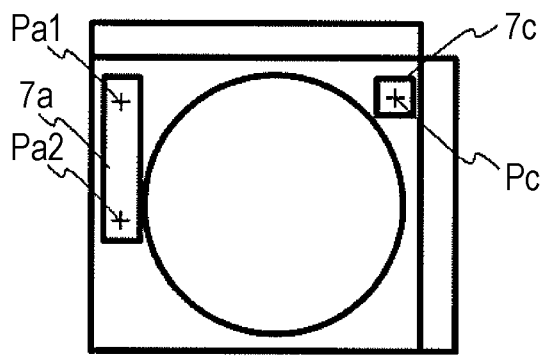

FIGS. 4A to 4C are layout diagrams of the adjustment sample 7 on the top table 4 in the present embodiment. As illustrated in FIGS. 4A to 4C, several examples of the arrangement position and the reference point of the adjustment sample 7 can be considered.

FIG. 4A illustrates an example in which three adjustment samples and three reference points are provided. In FIG. 4A, the three adjustment samples 7a, 7b, and 7c are installed at upper left, lower left, and upper right positions on the top table 4, respectively. In each adjustment sample, reference points Pa, Pb, and Pc for measuring reference information of a stage position correction map are set. In the correction processing to be described later, after the stage is moved to the positions of these reference points, the XY laser value, the Z sensor value, and the scale value are acquired. Therefore, each adjustment sample needs to be inside the top table 4 and in an effective range of the X mirror 15x and the Y mirror 15y (a position where the laser beam of the laser interferometer 16 can be emitted). At this time, by setting the three reference points to positions separated from each other, for example, a detection sensitivity of attitude angles θx and θy converted from the Z sensor value can be enhanced.

FIG. 4B illustrates an example in which four adjustment samples and four reference points are provided. The number of adjustment samples and reference points is preferably three or more, but is not limited to three, and four or more adjustment samples and reference points can be installed. In this case, there is a possibility that the accuracy is improved by the averaging effect as compared with the case of three adjustment samples and three reference points are provided.

FIG. 4C illustrates an example in which two adjustment samples and three reference points are provided. In FIG. 4C, two reference points Pa1 and Pa2 are set for the adjustment sample 7a. Total of three reference points are used, together with the reference point Pc set on the adjustment sample 7c. At this time, from the viewpoint of posture detection sensitivity, it is desirable to set the reference points set in the same adjustment sample so as to be distant from each other.

Note that the height of the adjustment sample 7 at the reference point is desirably set to be substantially the same as the height of the wafer 2 from the viewpoint of adjustment of the electron optical system, but in the present embodiment, the height is not necessarily the same as the height of the wafer 2. That is, it is sufficient that the heights of the adjustment samples are known, and there is no problem even if the heights are different.

Figure 5:
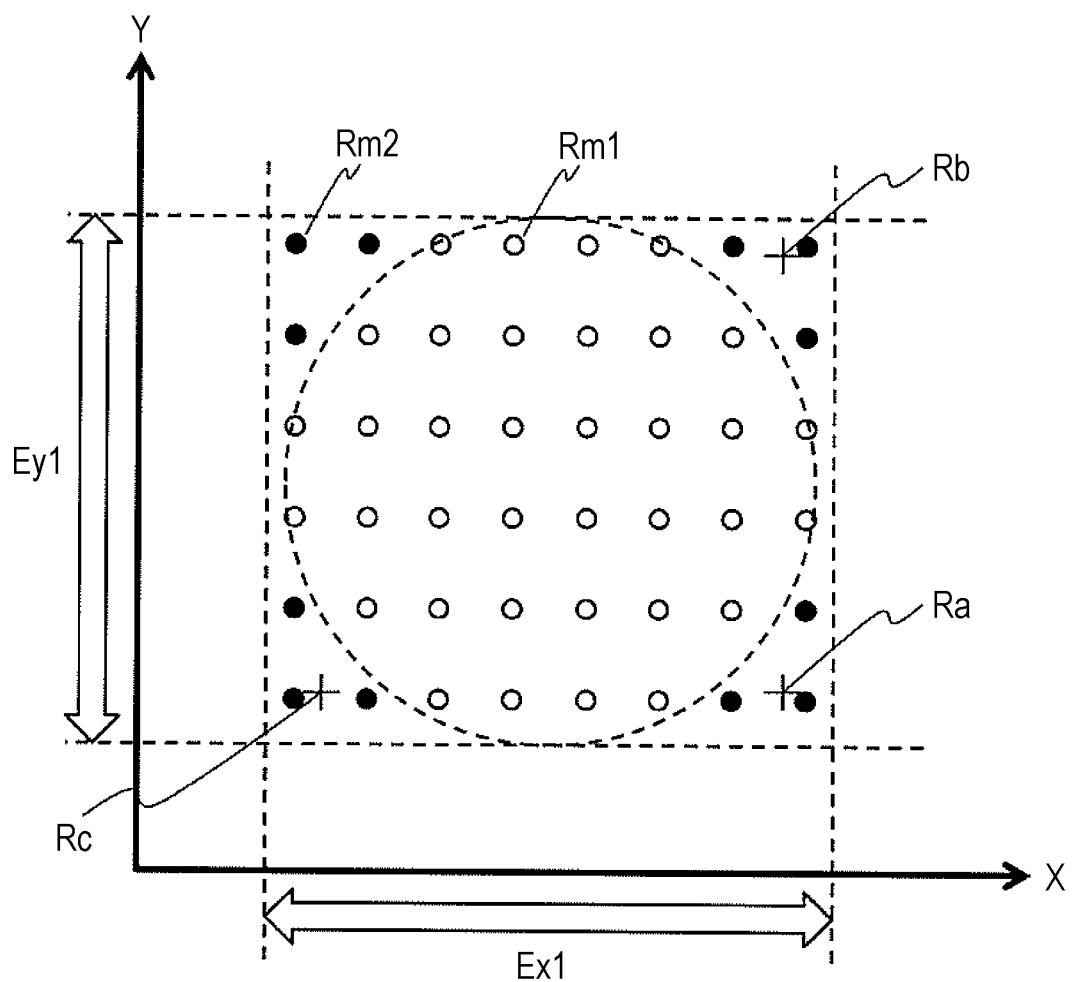
FIG. 5 is a conceptual diagram illustrating stage coordinates and correction points.

FIG. 5 is a conceptual diagram illustrating stage coordinates and correction points in the present embodiment. In FIG. 5, the horizontal axis represents the X coordinate of the stage, and the vertical axis represents the Y coordinate of the stage. Coordinates Ra, Rb, and Rc are stage coordinates when the reference points Pa, Pb, and Pc in FIG. 4A are observed by SEM, respectively. For example, in FIG. 4A, when the reference point Pa arranged on the upper left side of the top table 4 is observed by SEM, the stage needs to move to the lower right side (X axis+side, Y axis−side), and the side opposite to the physical arrangement in FIG. 4A is the stage coordinates. Ex1 is an X coordinate range in which the laser interferometer 16y is effective, that is, a length region of the Y mirror 15y. Similarly, Ey1 is a Y coordinate range in which the X laser interferometer 16x is effective, that is, a length region of the X mirror 15. A region surrounded by Ex1 and Ey1 is an effective range of the laser interferometer, and is a region in which SEM imaging can be performed. Correction points Rm1 and Rm2 are points distributed in a lattice point shape at regular intervals within the effective range of the laser interferometer. The correction point is a point at which data for position correction of the top table to be described later is acquired (that is, a point at which an actual measurement value of the position is acquired).

Since the correction point Rm1 (indicated by a white circle in FIG. 5) is a point within the range of the wafer 2, it is possible to acquire the Z sensor value together with the laser interferometer. On the other hand, the correction points Rm2 (indicated by a black circle in FIG. 5) near the four corners of the laser effective range cannot acquire the Z sensor value because the wafer 2 is not at the beam irradiation position. Therefore, at the correction point Rm1, the linear scale value, the laser value, and the Z sensor value are acquired as the correction information. On the other hand, at the correction point Rm2, since the Z sensor value cannot be acquired, the linear scale value and the laser value are acquired as the correction information. In addition, at the reference points Ra, Rb, and Rc, since the adjustment sample 7 adjusted to the same height as the wafer 2 is observed, all of the linear scale value, the laser value, and the Z sensor value can be acquired.

Figure 6:
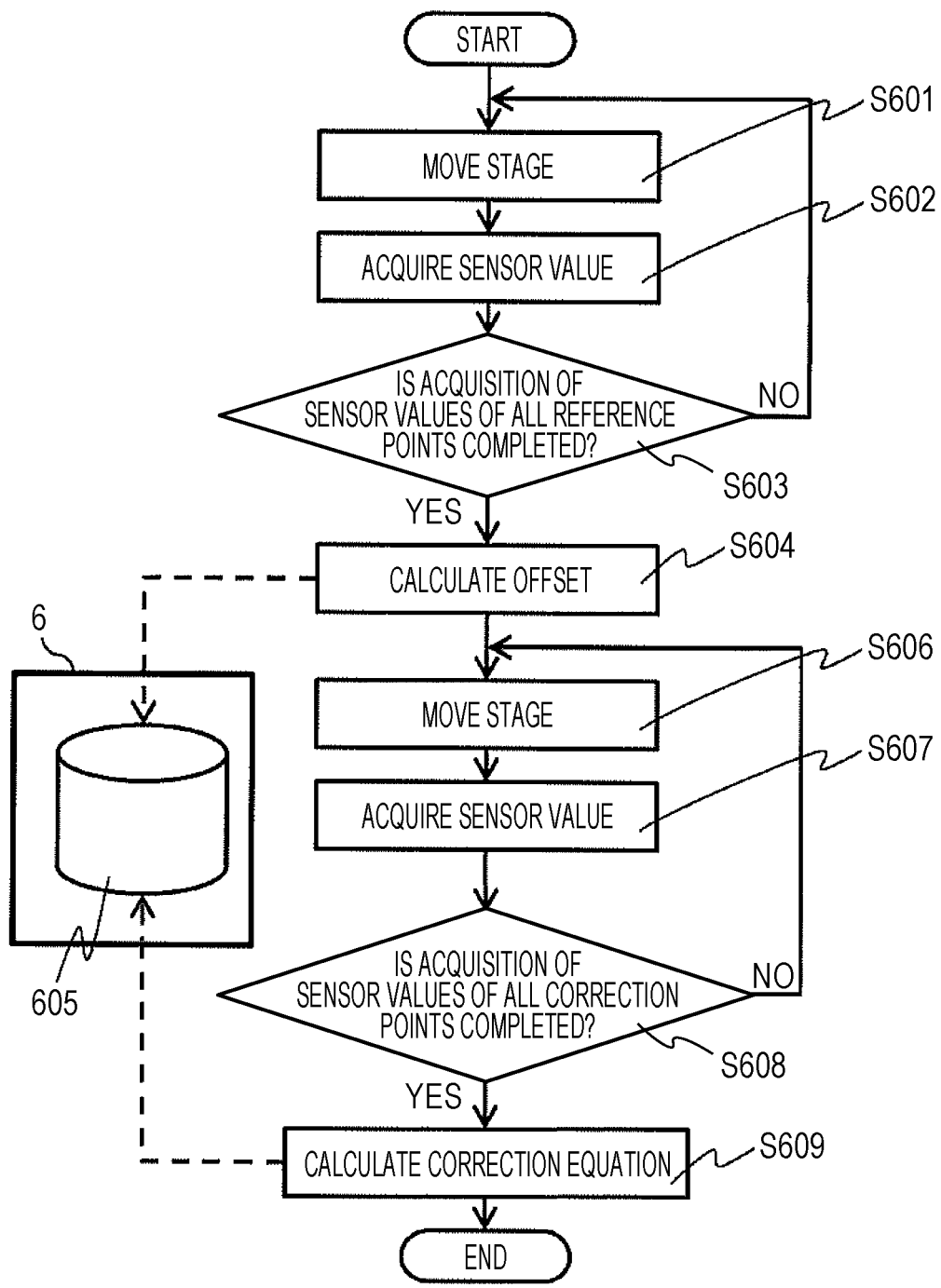
FIG. 6 is a flowchart illustrating a flow of correction map generation.

FIG. 6 is a flowchart illustrating a flow of correction map generation in the present embodiment. In this flowchart, the processing is started in a state where the wafer 2 is placed on the top table 4. This flowchart is performed by the control device 6.

In S601, the stage moves to a preset reference point position. In S602, the control device 6 acquires and stores the laser value, the linear scale value, and the Z sensor value at the reference point position. Each piece of sensor information is desirably acquired as average data for one second, for example. In S603, the control device 6 determines whether or not the acquisition of the sensor values of all the set reference points is completed. When all the reference point measurements are not completed, the processes of S601 and S602 are repeated, and when all the reference point measurements are completed, the process proceeds to S604. In the present embodiment, since the number of the reference points is 3, as a result, the processes of S601 and S602 are executed 3 times each.

In S604, the control device 6 calculates a deviation amount (offset amount) of the reference point from the initial value at the current time point using the sensor value measured in S602. Specifically, a difference between a coordinate (X, Y, and Z) and an attitude angle (θx, θy, and θz) of a reference point set in advance and the current stage position is calculated, and a difference amount is stored in the memory 605 (provided in the control device 6) as a reference point deviation amount in the current state. More specifically, for example, by using the Z sensor value at each of the three reference points, the deviation amount with respect to the height in the Z direction and the attitude angles in the θx and θy directions can be calculated. Similarly, the deviation amount can be calculated by using the laser value in the XY direction and the θz direction. Since there is a possibility that the offset amount changes due to an environmental change such as a temperature and pressure, it is possible to correct a variation between the time of actual operation described later and the time of execution of the flowchart by storing the stage state at the time of generation of the correction map in the present step.

In S606, the stage is moved to a preset correction point position. In S607, the control device 6 acquires and stores the laser value, the linear scale value, and the Z sensor value at the correction point position. Each piece of sensor information is desirably acquired as average data similarly to S602. In S608, the control device 6 determines whether or not the acquisition of the sensor values of all the set correction points has been completed. When all the correction point measurements are not completed, the processes of S606 and S607 are repeated, and when all the correction point measurements are completed, the process proceeds to S609. It is possible to determine the point of the correction point. If the number of correction points is set to be large, more accurate correction can be expected, but there are disadvantages that it requires an increase of the capacity of the storage memory and it takes time in generating the correction map. In the present embodiment, about several tens of correction points as illustrated in FIG. 5 are set, and the processes of S606 and S607 are executed several tens of times.

When the acquisition of the sensor values at all the correction points is completed, the control device 6 calculates a correction formula in S609. The correction formula is a function for calculating a control target position (a floating amount and an attitude angle in the floating system) for positioning the wafer 2 at a desired position with respect to the column 3 in each stage coordinate. The control target position is a target value of a relative position and an attitude angle between the Y table 5 and the top table 4 in each stage coordinate. As a form of the correction formula, a correction map type is effective in which the control target position in an arbitrary coordinate is calculated by a method such as linear interpolation or spline interpolation using the sensor value of the measurement point in FIG. 5. In this case, various coefficients for each coordinate used for interpolation are stored in the memory 605. As another method, it is also possible to realize a mathematical formula in which the control target position is calculated as a function of the X-Y coordinate by a method such as a least squares method using the sensor value obtained at the correction point. In this case, coefficients of mathematical formulas used for each correction are stored in the memory 605. Note that a degree related to the X-Y coordinate in the case of using a mathematical formula can be arbitrarily set, and it is also possible to use the degree as a fixed value regardless of the linear shape of the linear expression or the coordinate of the 0th order expression. These lower-order correction formulas are particularly effective when the number of correction points is small.

As described above, by using the correction formula stored in the memory 605, the control target position of the relative position and the attitude angle between the Y table 5 and the top table 4 can be calculated in arbitrary XY coordinates. By controlling the top table 4 using this, the wafer 2 can be positioned at a desired position with respect to the column 3 in every stage coordinate.

The correction map generation process illustrated in FIG. 6 can also be performed at the time of adjustment after assembly of the stage, at the time of periodic maintenance, or the like. As a result, it is possible to cope with temporal changes and maintain appropriate positioning accuracy.

In S604 and S609, it can be said that the information of the reference point offset and the correction formula stored in the memory 605 indicates the mechanical state of the stage mechanism. That is, a transition of the information stored in the memory 605 can be regarded as a stage mechanical change over time in a long period of time, and prediction of a maintenance time including component replacement of the stage mechanism, predictive diagnosis before failure, and the like can be performed.

Figure 7:
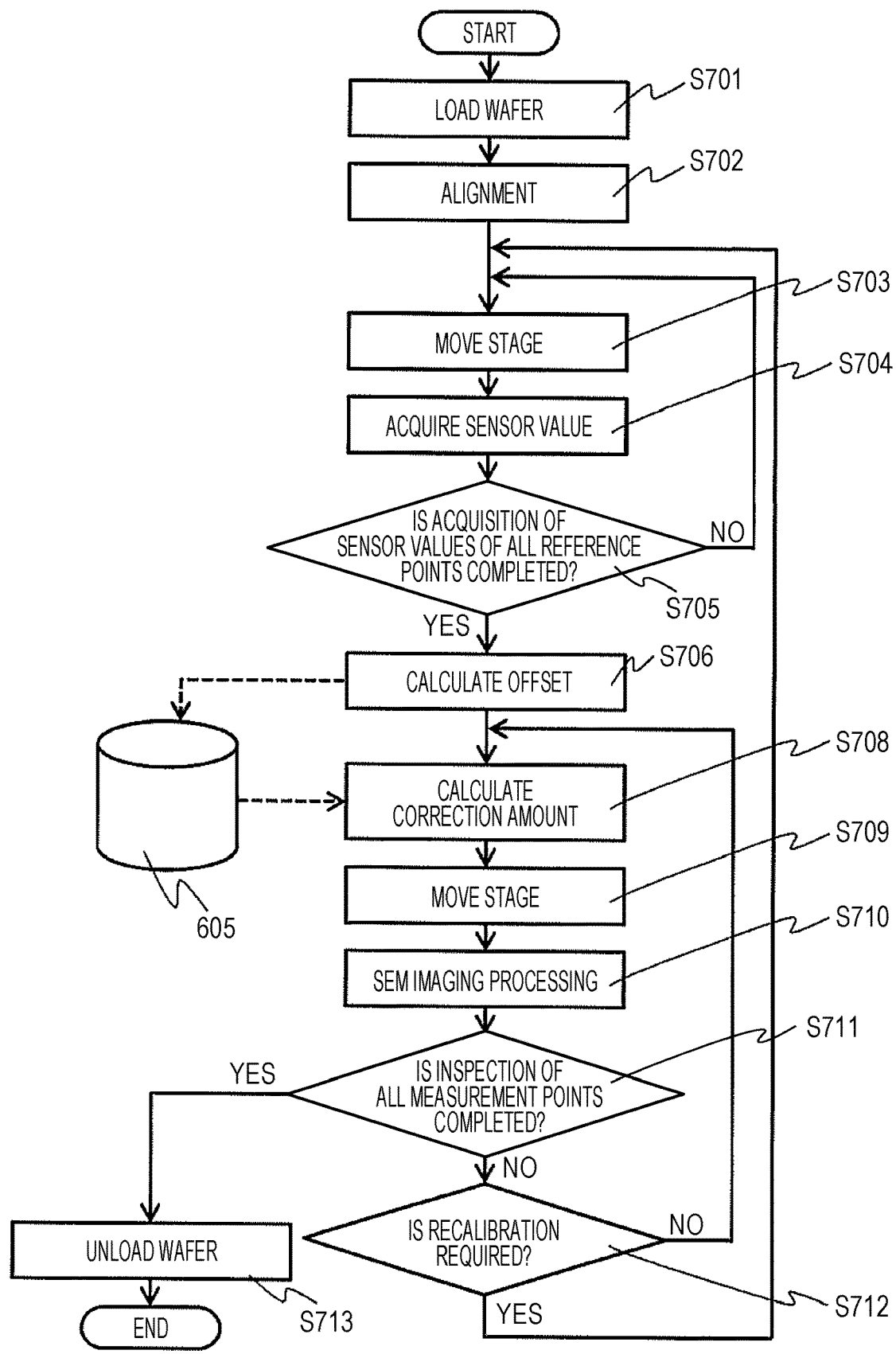
FIG. 7 is a flowchart illustrating a flow of wafer inspection processing.

FIG. 7 is a flowchart illustrating a flow of wafer inspection processing in the present embodiment. In this flowchart, the processing is started in a state before the inspection in which the wafer 2 is not placed on the top table 4. This flowchart is performed by the control device 6.

In S701, first, the wafer 2 is placed on the top table 4. In S702, the control device 6 performs alignment processing of detecting the arrangement position of the wafer 2 on the top table 4 using an optical microscope or an SEM.

In S703, the stage moves to a preset reference point position. In S704, the control device 6 acquires and stores the laser value, the linear scale value, and the Z sensor value at the reference point position. Each piece of sensor information is desirably acquired as average data for one second, for example. In S705, the control device 6 determines whether or not the acquisition of the sensor values of all the set reference points is completed. When all the reference point measurements are not completed, the processes of S703 and S704 are repeated, and when all the reference point measurements are completed, the process proceeds to S706. The processing of S703 to S705 is the same as the processing of S601 to S603 in FIG. 6.

In S706, the control device 6 calculates the current offset value using the sensor value measured in S704. The content of the arithmetic processing in S706 is similar to that in S604. The obtained offset amount is stored in the memory 605. As a result, the reference point offset amount at the time of generating the correction map calculated in S604 and the current reference point offset amount calculated in S706 are stored in the memory 605.

In S708, the control device 6 calculates a correction amount (control target position) at the measurement point of the next stage movement destination using the information in the memory 605. Specifically, first, the control target position in the stage coordinates at the movement destination is calculated (interpolation calculation or substitution of coordinate values into a mathematical formula) from the correction formula stored in the memory 605. The control target position (the floating amount and the attitude angle) at the next measurement point is calculated by adding the offset amount calculated in S706 to the control target position calculated by the correction formula.

The offset amount may be in any form as long as the difference of the current position with respect to the initial position of the reference point can be calculated. For example, the offset calculated in S604 may be included in the correction formula in advance, and in S706, a difference between the current reference point offset (S706) and the reference point offset (S604) at the time of generating the correction map may be obtained and the obtained difference may be added to the calculation result of the correction formula.

At S709, the control device 6 moves the stage to the next measurement point. At this time, by correcting the position of the top table 4 using the control target position (the floating amount and the attitude angle) calculated in S708, it is possible to always perform accurate positioning with respect to the column 3. In S710, the control device 6 captures an SEM image at a measurement point, and performs inspections or measurements of a pattern on the wafer 2 from the obtained image.

In S711, the control device 6 determines whether or not the inspection of all the set measurement points is finished, and in a case where all the measurement points are finished, the wafer 2 is unloaded in S713, and a series of wafer processing is finished. When the measurement point still remains in S711, it is determined whether or not recalibration is necessary in S712. This recalibration means that the offset calculation processing of the reference point (S703 to S706) is performed again. This is effective when the same wafer is continuously inspected for a long time and the stage structure is deformed due to a change in the stage itself or the surrounding environment (temperature, atmospheric pressure, or the like), and it can be expected that the accuracy of the position correction is improved by calculating the current reference point offset again.

As conditions for recalibration in S712, the following conditions are conceivable: (a) autofocus processing is often performed at the time of SEM imaging in S710. Therefore, the height deviation amount of the top table 4 from the time of creating a correction table is calculated (estimated) from the focus value after imaging (corresponding to the height of the wafer 2 from the column 3), and when the deviation amount exceeds a threshold, recalibration is performed. If the deviation amount can be estimated for the measurement result other than the height, the estimation result may be compared with a threshold to determine whether or not recalibration is necessary. As a measurement result other than the height, for example, inclination of the column or the like is considered; (b) recalibration is performed in a case where a condition in which the physical state of the stage or the charged particle beam device 100 itself is assumed to be changed is satisfied, such as a case where a certain period of time has elapsed from the previous reference point offset calculation or a case where a measurement value (for example, a stage temperature detected by a temperature sensor or an ambient temperature thereof) of a sensor that measures the physical state of the charged particle beam device 100 is changed by a certain amount or more; (c) a deviation amount (visual field deviation amount) of the measurement point pattern is detected from the image center in the SEM image after the SEM imaging. The SEM device is configured such that when a pattern to be observed is designated, the pattern is arranged at the center of the visual field. If the pattern to be observed is not arranged at the center of the visual field, it means that the visual field deviation amount is occurred. In a case where the visual field deviation amount is larger than the threshold, recalibration is performed.

As described above, in the actual wafer inspection processing illustrated in FIG. 7, the current reference point offset amount, the information on the correction point measured in advance, and the reference point offset amount at that time are used, so that highly accurate correction can be realized without lowering the inspection throughput.

<Summary of the Present Invention>

As described above, the charged particle beam device 100 according to the present embodiment may accurately and quickly position the position of the top table 4 with respect to the column 3 by correcting the relative position between the Y table 5 and the top table 4 even when there is deformation, posture change, sensor assembly error, or the like of the lower axis table. That is, the correction table is created in advance using the accurate coordinates of the reference point, and the control target position is derived using the correction table when the stage position is designated, whereby the stage can be accurately positioned while the relative position between the Y table 5 and the top table 4 is controlled.

<Modifications of the Present Invention>

In the above embodiment, the linear guide is used as the guide mechanism of the lower shaft, and the magnetic bearing is used as the guide mechanism of the upper shaft. However, any combination using other guide mechanisms (for example, a fluid bearing, an elastic support structure, or the like) is possible. In addition, the top table 4 is movable with six degrees of freedom including the X direction with respect to the Y table 5, but it is sufficiently possible to restrain a part of the top table 4 using an elastic support structure or the like.

In the above embodiment, the position of the top table 4 with respect to the sample chamber 1 is measured by the laser interferometer 16, but other measuring instruments may be used. For example, it is conceivable to use an optical sensor or the like.

In the above embodiment, the correction points are configured in a lattice point shape as illustrated in FIG. 5, but points other than the lattice points can be set as the correction points.

In the above embodiment, the recalibration is automatically executed when it is determined that recalibration is necessary in S712, but instead of or in combination with this, a method of displaying a warning prompting the user to perform recalibrate is also effective.

In the above embodiment, the control device 6 can be configured by hardware such as a circuit device on which the function is implemented, or can be configured by executing software on which the function is implemented by an arithmetic device such as a central processing unit (CPU).

What is claimed is:

1. A charged particle beam device that irradiates a sample with a charged particle beam, the charged particle beam device comprising:
    a sample chamber;
    a first movement table movable in a first direction with respect to the sample chamber;
    a second movement table movable in a plurality of directions with respect to the first movement table;
    a lens barrel disposed above the second movement table and configured to irradiate the sample with the charged particle beam;
    a position detection unit that measures a first relative position between the sample chamber and the first movement table, a second relative position between the sample chamber and the second movement table, and a third relative position between the lens barrel and the sample; and
    a control unit that drives the first movement table and the second movement table,
    wherein
    the control unit corrects a relative position between the first movement table and the second movement table according to the first relative position and the second relative position,
    the control unit acquires a first set of the first relative position at a reference point on the second movement table, the second relative position at the reference point, and the third relative position at the reference point,
    the control unit calculates an offset amount between known coordinates of the reference point and a measured value of coordinates of the reference point using the first set, and
    the control unit corrects a positional deviation of the second movement table with respect to a target position of the second movement table using the offset amount.

2. The charged particle beam device according to claim 1, wherein
    the position detection unit measures the first relative position using a linear scale,
    the position detection unit measures the second relative position using a laser interferometer or an optical sensor, and
    the position detection unit measures the third relative position using an optical sensor.

3. The charged particle beam device according to claim 1, wherein
    the control unit acquires at least one of
    a second set of the first relative position at a correction point on the second movement table and the second relative position at the correction point,
    or
    a third set of the first relative position at the correction point, the second relative position at the correction point, and the third relative position at the correction point,
    the control unit specifies a correction formula for calculating a control target position for moving the second movement table to a designated position with reference to the correction point using at least one of the second set and the third set, and
    the control unit uses the correction formula to position the second movement table with respect to the designated position.

4. The charged particle beam device according to claim 3, wherein
    the control unit specifies the correction formula as a function of a relative position between the first movement table and the second movement table and a relative posture between the first movement table and the second movement table.

5. The charged particle beam device according to claim 3, wherein
    the correction formula is configured to calculate the control target position in coordinates between the plurality of correction points by interpolating measurement results by the position detection unit at the plurality of correction points.

6. The charged particle beam device according to claim 1, wherein
    the reference point is arranged at a position on an adjustment sample installed on the second movement table, and
    the reference point is disposed within a range in which the position detection unit is capable of measuring the second relative position.

7. The charged particle beam device according to claim 6, wherein
    the reference points are arranged at three or more points on the second movement table.

8. The charged particle beam device according to claim 3, wherein
    the position detection unit measures the first relative position and the second relative position and does not measure the third relative position with respect to the correction point that is not on the sample,
    the position detection unit measures the first relative position, the second relative position, and the third relative position with respect to the correction point on the sample,
    the control unit acquires the second set for the correction points that are not on the sample, and
    the control unit acquires the third set for the correction points on the sample.

9. The charged particle beam device according to claim 1, wherein
the control unit estimates whether or not a current value of the first set is changed by a threshold or more from a time point at which the offset amount is calculated,
the control unit re-measures the first set by the position detection unit in a case where it is estimated that the current value of the first set changes by the threshold or more, and
the control unit recalculates the offset amount using the first set acquired by the re-measurement.

10. The charged particle beam device according to claim 1, wherein
the control unit estimates whether or not a current value of the first set is changed by a threshold or more from a time point at which the offset amount is calculated, and
the control unit outputs a message prompting the position detection unit to re-measure the first set in a case where it is estimated that the current value of the first set is changed by the threshold or more.

11. The charged particle beam device according to claim 1, wherein
the control unit estimates whether or not a current value of the first set is changed by a threshold or more from a time point at which the offset amount is calculated,
the control unit re-measures the first set by the position detection unit or outputs a message prompting re-measurement in a case where it is estimated that the current value of the first set is changed by the threshold or more, and
the control unit performs the estimation by using at least one of an elapsed time from acquisition of the first set or a change amount of a physical state of charged particle beam device from a time point at which the first set is acquired.

12. The charged particle beam device according to claim 1, wherein
the control unit generates an observation image of the sample by using a result of detecting secondary particles generated by irradiating the sample with the charged particle beam,
the control unit estimates whether or not a current value of the first set is changed by a threshold or more from a time point at which the offset amount is calculated,
the control unit re-measures the first set by the position detection unit or outputs a message prompting re-measurement in a case where it is estimated that the current value of the first set is changed by the threshold or more, and
the control unit performs the estimation according to whether or not a deviation amount of a visual field center of the observation image exceeds a threshold.

13. A charged particle beam device that irradiates a sample with a charged particle beam, the charged particle beam device comprising:
a sample chamber;
a first movement table movable in a first direction with respect to the sample chamber;
a second movement table movable in a plurality of directions with respect to the first movement table;
a lens barrel disposed above the second movement table and configured to irradiate the sample with the charged particle beam;
a position detection unit that measures a first relative position between the sample chamber and the first movement table, a second relative position between the sample chamber and the second movement table, and a third relative position between the lens barrel and the sample; and
a control unit that drives the first movement table and the second movement table,
wherein
the control unit corrects a relative position between the first movement table and the second movement table according to the first relative position and the second relative position,
the control unit acquires a first set of the first relative position at a reference point on the second movement table, the second relative position at the reference point, and the third relative position at the reference point,
the control unit calculates an offset amount between known coordinates of the reference point and a measured value of coordinates of the reference point using the first set,
the control unit acquires at least one of
a second set of the first relative position at the correction point and the second relative position at the correction point on the second movement table,
or
a third set of the first relative position at the correction point, the second relative position at the correction point, and the third relative position at the correction point,
the control unit specifies a correction formula for calculating a control target position for moving the second movement table to a designated position with reference to the correction point using at least one of the second set and the third set, and
the control unit calculates the control target position using the correction formula and adds the control target position and the offset amount to position the second movement table with respect to the designated position.

* * * * *